United States Patent
Chaffins et al.

(10) Patent No.: US 12,358,243 B2
(45) Date of Patent: Jul. 15, 2025

(54) PRINTING CONDUCTIVE ELEMENTS

(71) Applicant: Peridot Print LLC, Palo Alto, CA (US)

(72) Inventors: Sterling Chaffins, Corvallis, OR (US); Thomas A. Saksa, Corvallis, OR (US); Kevin P. Dekam, Corvallis, OR (US); Terry McMahon, Corvallis, OR (US); Donald W. Schulte, Corvallis, OR (US); Jami Ryan Barone, Corvallis, OR (US); Douglas Pederson, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 41 days.

(21) Appl. No.: 18/413,468

(22) Filed: Jan. 16, 2024

(65) Prior Publication Data
US 2024/0149542 A1   May 9, 2024

Related U.S. Application Data

(63) Continuation of application No. 16/089,130, filed as application No. PCT/US2017/029642 on Apr. 26, 2017, now abandoned.

(51) Int. Cl.
*B29C 64/165* (2017.01)
*B22F 10/14* (2021.01)
(Continued)

(52) U.S. Cl.
CPC ............ *B29C 70/882* (2013.01); *B22F 10/14* (2021.01); *B22F 10/36* (2021.01); *B29C 64/153* (2017.08);
(Continued)

(58) Field of Classification Search
CPC ... B29C 64/153; B29C 64/165; B29C 64/386; B29C 64/393; B29C 64/264; B22F 10/14; B22F 10/36; B33Y 50/00; B33Y 50/02
See application file for complete search history.

(56) References Cited

U.S. PATENT DOCUMENTS 9,465,477 B2   10/2016   Rosenberg et al.
2009/0004381 A1   1/2009   Fujisawa et al.
(Continued)

FOREIGN PATENT DOCUMENTS

CN   104461211 A   3/2015
WO   2004/044816 A1   5/2004
(Continued)

OTHER PUBLICATIONS

Burstyn et al, "PrintPut: Resistive and Capacitive Input Widgets for Interactive 3D Prints", Human-Computer Interaction, Sep. 2015, pp. 332-339.
(Continued)

*Primary Examiner* — Andrew L Swanson
(74) *Attorney, Agent, or Firm* — Michael Dryja

(57) ABSTRACT

In an example, an apparatus includes processing circuitry comprising a model assessment module to identify an indication of a conductive element within object model data representing an object to be printed and a print instruction module to generate print instructions to generate the object. The print instructions may include an instruction to print conductive agent to form the conductive element and an instruction to print a fusing agent comprising an instruction to reduce an amount of fusing agent to be printed in a region of the conductive element compared to at least one other region of the object.

6 Claims, 4 Drawing Sheets

(51) Int. Cl.
*B22F 10/36* (2021.01)
*B29C 64/153* (2017.01)
*B29C 64/393* (2017.01)
*B29C 70/88* (2006.01)
B33Y 30/00 (2015.01)
B33Y 50/02 (2015.01)

(52) U.S. Cl.
CPC .......... *B29C 64/165* (2017.08); *B29C 64/393* (2017.08); *B33Y 30/00* (2014.12); *B33Y 50/02* (2014.12)

(56) References Cited

U.S. PATENT DOCUMENTS

| | | |
|---|---|---|
| 2014/0070957 A1 | 3/2014 | Longinotti-Buitoni et al. |
| 2015/0201500 A1 | 7/2015 | Shinar et al. |
| 2017/0014911 A1 | 1/2017 | Ng et al. |
| 2017/0106596 A1 | 4/2017 | Okamoto et al. |

FOREIGN PATENT DOCUMENTS

| | | | | |
|---|---|---|---|---|
| WO | WO-2015136277 A1 | * | 9/2015 | .............. B22F 10/00 |
| WO | 2016/080993 A1 | | 5/2016 | |
| WO | 2016/146374 A1 | | 9/2016 | |
| WO | 2016/186613 A1 | | 11/2016 | |

OTHER PUBLICATIONS

Glasschröder et al, "Powder-bed-based 3D-printing of function integrated parts", Rapid Prototyping Journal, Mar. 16, 2015, vol. 21, No. 2, pp. 775-792.

* cited by examiner

PRINTING CONDUCTIVE ELEMENTS

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected regions. In other techniques, chemical solidification methods may be used.

BRIEF DESCRIPTION OF DRAWINGS

Non-limiting examples will now be described with reference to the accompanying drawings, in which.

DETAILED DESCRIPTION

Figure 1:
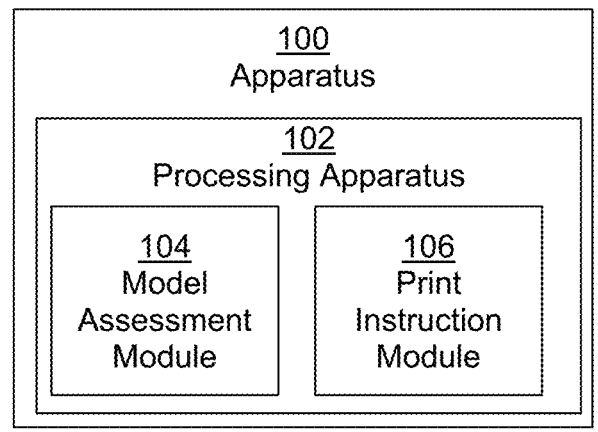
FIG. 1 is a schematic drawing of an example apparatus for generating print instructions.

Additive manufacturing techniques may generate a three-dimensional object through the solidification of a build material. In some examples, the build material may be a powder-like granular material, which may for example be a plastic, ceramic or metal powder. The properties of generated objects may depend on the type of build material and the type of solidification mechanism used. Build material may be deposited, for example on a print bed and processed layer by layer, for example within a fabrication chamber.

In some examples, selective solidification is achieved through directional application of energy, for example using a laser or electron beam which results in solidification of build material where the directional energy is applied. In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material coalesces and solidifies to form a slice of the three-dimensional object in accordance with the pattern. In other examples, coalescence may be achieved in some other manner.

In addition to a fusing agent, in some examples, a print agent may comprise a coalescence modifying agent (referred to as modifying or detailing agents herein after), which acts to modify the effects of a fusing agent for example by reducing or increasing coalescence or to assist in producing a particular finish or appearance to an object, and such agents may therefore be termed detailing agents. Detailing agents may have a cooling effect, for example comprising a fluid which may be evaporated on heating, and may therefore be termed fusion reduction agents. A coloring agent, for example comprising a dye or colorant, may in some examples be used as a fusing agent or a modifying agent, and/or as a print agent to provide a particular color for the object. In some examples, an agent may be used to introduce functionality into an object. For example, a conductive agent (which may comprise fusible metallic particles, such as silver nanoparticles) may be utilised to introduce a conductive track.

Additive manufacturing systems may generate objects based on structural design data. This may involve a designer generating a three-dimensional model of an object to be generated, for example using a computer aided design (CAD) application. The model may define the solid portions of the object. To generate a three-dimensional object from the model using an additive manufacturing system, the model data can be processed to generate slices of parallel planes of the model. Each slice may define a portion of a respective layer of build material that is to be solidified or caused to coalesce by the additive manufacturing system.

Incorporation of electronic circuitry into generated objects may result in highly functional articles having many diverse uses.

FIG. 1 is an example of an apparatus 100, which may be a processing apparatus for generating print instructions for use in 3D printing. The apparatus 100 comprises processing circuitry 102 which comprises a model assessment module 104 and a print instruction module 106.

In use of the apparatus 100, the model assessment module 104 identifies an indication of a conductive element within object model data representing an object to be printed. Such object model data may describe various aspects of an object, for example its geometry and in some examples properties such as appearance properties (e.g. color, transparency and the like) and functional properties such as or conductivity, density, porosity, strength, and the like.

In some examples, a three-dimensional object may be characterised in terms of 'voxels', i.e. three-dimensional pixels, wherein each voxel represents a discrete volume. In data modelling a three-dimensional object, a voxel at a given location may have at least one characteristic. For example, it may be empty, may have a particular color and/or may represent a particular material, or a particular object property, or the like. The voxels representing an object may have the same shape (for example, cubic or tetrahedral), or may differ in shape and/or size. A voxel may correspond to a region of a three-dimensional object which is an individually addressable volume in additive manufacturing. In some examples in which the intended solidification and/or physical properties may be achieved by printing an agent onto a layer of the build material to form a slice of an object, a voxel size may be defined by the thickness of a layer of build material and the surface area of a layer which can individually be addressed with an agent. In some contexts, a voxel may be the resolution to which an object model, an object, or object generation data, is defined.

In some examples, the model assessment module 104 may identify an indication of a conductive element based on a conductivity specification which exceeds a threshold for one or more voxels (or otherwise identified object region), or based on a tag or label applied to one or more voxels (or otherwise identified object region).

The print instruction module 106 generates print instructions to generate at least a portion of the object, for example a layer thereof. The print instructions may be generated to print conductive agent to form the conductive element and to print a fusing agent such that an amount of fusing agent to be printed in a region of in which the conductive element is to be formed is reduced compared to at least one other region of the object. As used herein, the term 'fusing agent' is utilised to describe a print agent with the primary purpose of causing fusion of the build material, and may be contrasted with conductive agent which is applied principally to provide a conductive element. However, as will be appreciated from the description that follows, it is possible for a fusing agent to comprise conductive materials and properties and/or for a conductive agent to contribute to the fusion of build material. In some examples, conductive agents comprise metallic particles and fusing agents are non-metallic.

In some examples, the amount of fusing agent to be printed in a region of the conductive element may be reduced to zero. As further detailed below, the amount of fusing agent printed in at least one other region may be controlled so as to provide a substantially insulating composition for such material. The composition may be substantially insulating in that it is not conductive at the intended voltages of use of the conductive element.

Conductive agents may comprise metallic elements. For example, the conductive agent may comprise nanoparticles, which may be silver nanoparticles, for example suspended in a carrier fluid which may comprise water or a solvent. Such nanoparticles have been found to fuse at around or below the temperatures employed in additive manufacturing (noting that this temperature may vary based on the build materials being used and other attributes such as the size of the nanoparticles). However, conductive materials are often also good thermal absorbers, so will tend to absorb energy from an applied energy source and heat the build material and can thereby cause or contribute the fusion thereof as noted above.

In 3D printing, thermal management is a concern: a build material is to be sufficiently heated such that coalescence is achieved, but overheating can impair an object's form, appearance and/or functionality. Fusing agents are selected in part for their radiation absorbing qualities. Generally, given an intended irradiation level, an amount of fusing agent to be applied may be determined based on an intended temperature increase in that region of the object under generation. In examples herein, the fusing agent is applied is reduced, in some examples to zero, in the region in which the conductive element is to be formed. This may nevertheless result in coalescence of build material as the conductive agent may be an absorber of energy and serve to heat the build material. Taking this into account, the amount of fusing agent may be reduced and a fusing temperature still acquired. In some examples, this may be achieved using an increased irradiation level.

Controlling the amount of fusing agent both in the region in which the conductive element is to be formed and in a surrounding region may have a further practical effect. In some examples, fusing agents themselves comprise conductive materials. For example, the fusing agent may comprise a 'carbon black' print agent. This is an effective absorber of heat, but is also somewhat conductive. It may be intended to surround the conductive element in an insulating surrounding. This may be achieved by limiting the amounts of conductive fusing agent applied in the vicinity of the conductive element, for example to be below a threshold. Moreover, if limited amounts of fusing agent are applied to the same locations (e.g. voxels) as the conductive agent, this means that the conductivity of the conductive element may be determined by the conductive agent substantially in isolation of any effect of the fusing agent (which may simplify the specification thereof). In addition, limiting the amount of fusing agent may improve or constrain the saturation of the conductive agent in the build material.

In some examples, therefore, if the model assessment module 104 does not identify an indication of a conductive element within object model data representing an object to be printed, the print instruction module 106 may generate print instructions to generate the object using an amount of fusing agent which is higher than if an indication of a conductive element is identified (at least when compared to the region around the conductive element).

In some examples in which the amount of fusing agent to be applied is to be controlled to below a threshold (e.g. when an indication of a conductive element is identified by the model assessment module 104), a suitable mechanism may be employed to compensate for the reduced fusing capacity, for example by increasing an irradiation intensity and/or irradiation time. As the amount of fusing agent may be thought of as relating to the capacity of the build material coated in the fusing agent to absorb heat, one form of compensation may be to increase the amount of energy applied, for example by longer exposure to heat lamps such as overhead halogen lights or lamps attached to a print agent distributor, e.g. a print head, or the like. Where heat sources are associated with a print agent distributor, one or more 'non-printing' pass may be used to increase the exposure of the fusing agent to radiation.

For example, it may be the case that the amount of fusing agent employed in fusing a portion of a layer which is intended to include a conductive element may be reduced by a factor of around 4 or 5 when compared to a layer of an object or object portion which does not include a conductive element. For example, the fusing agent may be printed at a contone level of around 60-80 in an object or object portion which does not contain a conductive element (and therefore the insulating quality of the build material when fused may be of less concern) and at a contone level of around 10-20 in at least region of a part which does contain the conductive element.

Further, in some examples, it may be intended that the conductive element is formed on a surface of the object, for example such that an electrical connection may be made thereto by surface contact. To this end it may be that it is intended that the conductive agent is not unduly encapsulated below the surface of an object (for example, if the conductive element is not formed on the surface, this may be so that minimal post processing is indicated to expose the conductive element). In other examples, the conductive element may be intended to form a sub-surface via. By controlling the amount of fusing agent in the region in which the conductive element is to be formed (in some examples to zero), and the order in which fusing agent and conductive agent are applied, the position of the conductive element within a layer may be controlled.

In some examples, the print instruction module 106 generates print instructions to print the conductive agent in a first printing pass of a layer of build material and to print fusing agent in a second printing pass of the build material, and further to generate heating instructions to heat the layer of build material in association with (i.e. before, during and/or after) each printing pass. This allows the carrier fluid in the conductive agent to be evaporated off before fusion takes place.

In some examples, the print instruction module 106 generates print instructions to print fusion reducing agent (e.g. a detailing agent) in the first printing pass in a region of the object which is not a region of the conductive element. This may prevent thermal gradients from developing across the layer of build material as the detailing agent may be evaporated in a manner which is similar (or in some examples matched to) the evaporation of the conductive agent carrier fluid.

In some examples, the print instruction module 106 generates the print instructions to perform a non-print pass after printing the conductive agent and printing the fusing agent and heating the layer in association with the non-print pass. In some examples, this may be an irradiation pass utilizing for example a radiation source such as a heat lamp, mounted on a print agent distributor. Such non-print passes may allow the heat lamp to be passed over the build material and irradiate it. This increases the amount of time for which the radiation source travels over the build material and thereby allows the heat to build, again allowing the amount of fusing agent to be applied to be kept low. In some examples, such a non-print pass may be performed before printing in order to raise the temperature of the underlying build material before any print agent is applied thereto. In other examples, the amount of time for which the radiation source travels over the build material may be increased in some other way, for example by slowing the motion of the print agent distributor. In some examples, for example where a radiation source is arranged in a manner other than on a print agent distributor, the heat may be allowed to build by allowing exposure to the radiation source, for example in a time delay between printing passes. In some examples, the intensity of radiation from at least one radiation source may be increased.

In some examples, the print instruction module 106 generates the print instructions for each of a plurality of layers of build material, and the conductive element lies at least in part in each of the plurality of layers. This allows the conductive element to be of any shape or form within the printed object.

Figure 2:
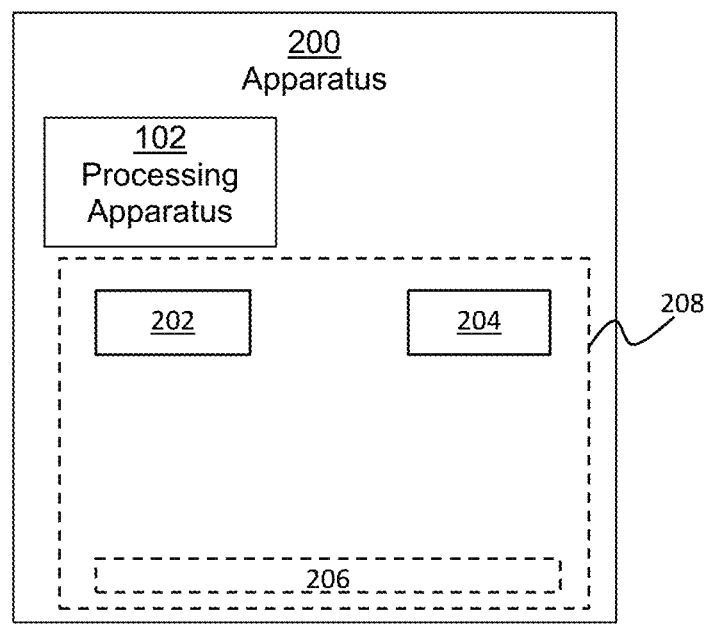
FIG. 2 is a schematic drawing of an example of a print apparatus.

FIG. 2 is an example of additive manufacturing apparatus 200, wherein the additive manufacturing apparatus 200 comprises the processing circuitry 102 described above and further comprises a print agent distributor 202 and an energy source 204, which in this example are arranged above a print bed 206 within a fabrication chamber 208. The additive manufacturing apparatus 200 may be to print an object according to the print instructions. In some examples, the energy source 204 (which may comprise a heat lamp or the like) may be mounted on the print agent distributor 202 and may be scanned over the surface of the print bed when applying print agent.

Figure 3A:
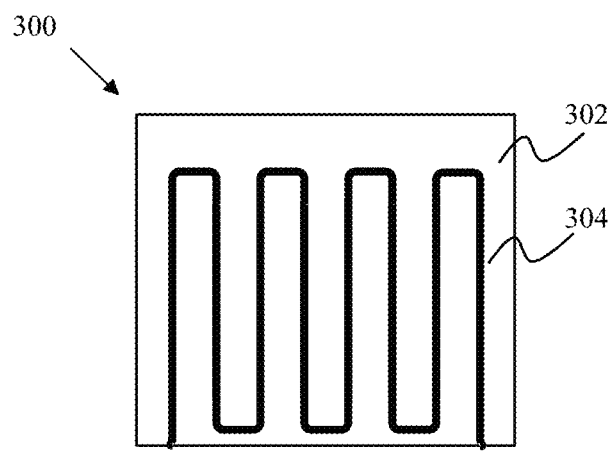
FIG. 3A-3D are example of conductive elements.
Figure 3B:
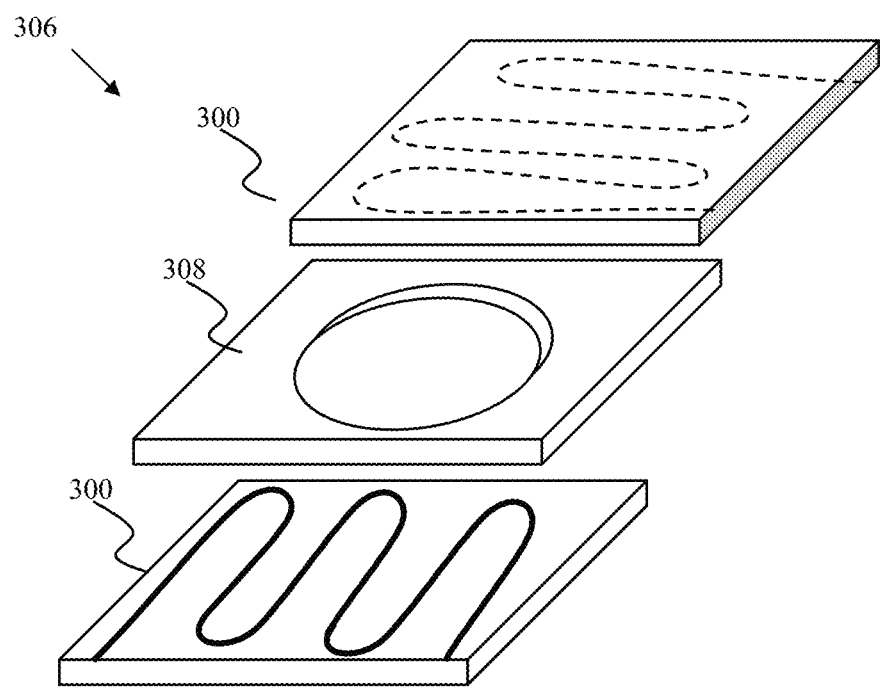

FIG. 3A-D show examples of conductive elements which may be generated using the apparatus and/or methods as described herein. A first example of a conductive element 300 is shown in FIG. 3A. This comprises a planar portion of build material 302 having a conductive track 304 formed therein. This may be formed into a 'push switch' 306, as is shown in FIG. 3B. This push switch 306 comprises two such conductive elements 300 separated by a spacer 308, which may for example have a thickness of around 300 microns, the spacer 308 comprising a cut-out to allow the conductive tracks 304 to be brought into contact with one another. The portions of the switch 306 may be formed separately.

Figure 3C:
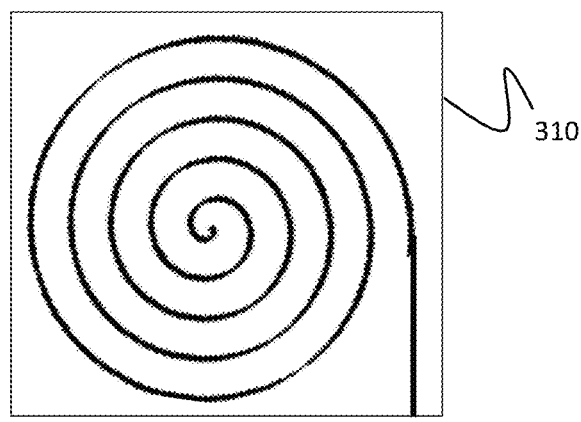

FIG. 3C shows an example of a printed coil antenna 310, which may for example be used as a component in near-field communication device, for example a security pass or the like. In such examples, the amount of print agent applied to the material around the coil-like conductive track may be selected so as to provide intended electrical performance. This may comprise applying a fusing agent and/or a detailing agent.

Figure 3D:
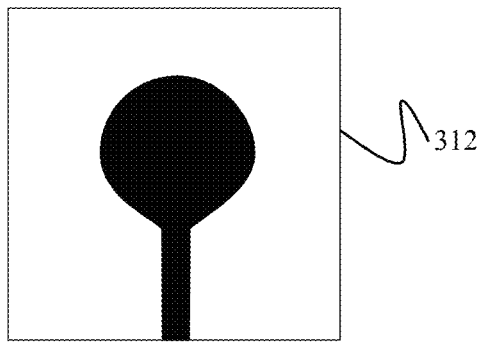

FIG. 3D shows an example of a printed touchpad 312, which may be used as a capacitive sensing device. In some examples, such a touchpad 312 may be formed in more than one layer of build material in order to enhance the sensitivity thereof. In some examples, such touchpads 312 may be embedded under one or more layers of fused build material which is not treated with conductive agent, which may protect them from damage. While a planar example is shown here, such touchpads 312 may be formed in curved surfaces.

Other conductive elements, including a variety of wires, switches, resistors, capacitive elements and the like may be formed or printed in a similar manner. In some examples, some post processing may be carried out to expose conductive elements.

Figure 4:
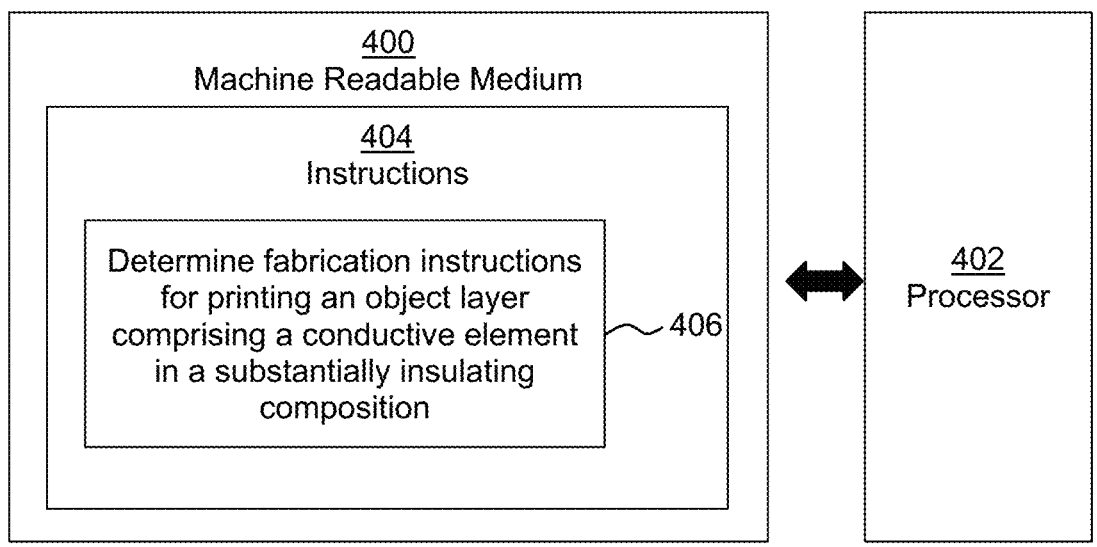
FIG. 4 shows a machine readable medium in association with a processor.

FIG. 4 is an example of a machine readable medium 400 in association with a processor 402. The machine readable medium 400 comprises instructions 404 which when executed by the processor 402 cause the processor to carry out certain processes.

In this example, the instructions 404 comprises instructions 406 to determine fabrication instructions for printing an object layer comprising a conductive element in a substantially insulating composition.

The fabrication instructions may control an amount of at least one fusing agent applied to a region of the layer to provide the insulating composition having predetermined performance parameters and further comprise irradiation instructions to control irradiation of the layer based on the amount of fusing agent to be applied. For example, the amount of fusing agent may be relatively low in order to obtain an insulating composition which is non-conductive to an intended level (i.e. has an insulation, or resistive performance parameter), and the irradiation may be determined to cause fusion of the object given the relatively low amounts of fusing agent.

In some examples, the instructions 404 may comprise instructions to print a fusible conductive agent to provide the conductive element. For example, this may comprise a print agent comprising metallic nanoparticles, such as silver nanoparticles, which may be available with fusing temperatures of around 150° C. Such a conductive print agent may for example comprise conductive particles in a carrier fluid such as a solvent or water.

Figure 5:
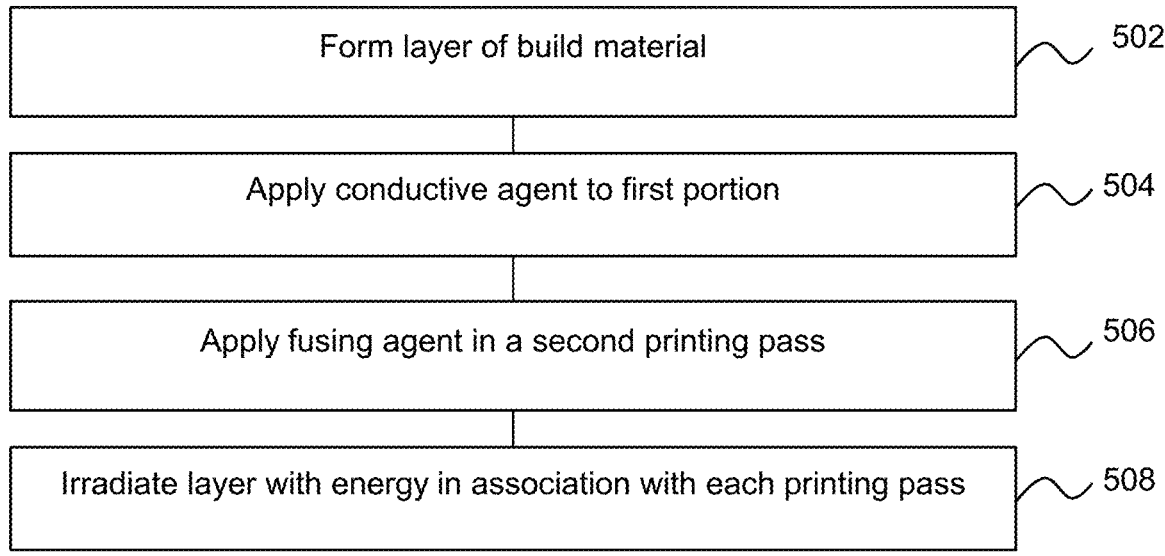
FIGS. 5 and 6 are flowcharts of example methods of printing conductive elements.

FIG. 5 is an example of a method, which may be a method for generating a conductive element within a 3D printed object. In some examples, the conductive element is to be formed on or near the surface of a 3D printed object. In some examples, the conductive element is to be formed within a 3D printed object.

Block 502 comprises forming a layer of build material. This may for example be formed on a print bed or on top of a previously formed layer of build material. In some examples, the layer of build material is formed of a powder-like or granular build material, which may for example comprise a plastic, for example a polyamide 12 plastic.

Block 504 comprises applying a conductive agent to a first portion of the layer in a first printing pass. This may be a fusible conductive agent as has been described above. In some examples, a cooling agent (e.g. a detailing agent) is printed to at least one other portion in the first printing pass.

Block 506 comprises applying fusing agent in a second printing pass, wherein the fusing agent is applied with a first coverage to a second portion of the layer and the coverage is reduced compared the first coverage in the first portion of the layer. The second portion of the layer may be intended to form a non-functional portion of the object (i.e. a portion of the object which does not form part of an electric circuit).

In such a portion, it may be that the fusing agent is selected to deliver heat into the layer of build material and the amount of fusing agent applied may be sufficient to, when energy is applied (for example from a heat lamp or the like), raise the temperature of the build material to its fusing temperature. The precise amount of fusing agent to cause this effect will vary based on, for example, any or any combination of the choice of build material, a thickness of the layer, a choice of fusing agent, a level of energy delivered by an energy source, a duration of energy delivery, thermal transfers within the object under generation, environmental conditions and the like, but may be determined for a given set of circumstances.

The first coverage may be selected so as to achieve a conductivity below a threshold in a fused build material. This may be achieved through the choice of agent and/or through the amount of agent applied. For example, the conductivity may be selected so as to be significantly lower than a region of the build material which is intended to contain a conductive element, or in an object as a whole which is contain a conductive element.

Block 508 comprises irradiating the layer with energy in association with each printing pass. This may for example be carried out in conjunction with a printing pass (for example using an energy source associated with a print agent distributor), or after each printing pass. As has been discussed above, thermal absorption properties within the conductive agent may be utilised to increase the temperature of the build material such the fusing temperature may be reached even if less fusing agent is applied. By printing the conductive agent first, the carrier fluid in the conductive agent may be caused to evaporate. However, in other examples, the second printing pass could be carried out before the first printing pass.

Figure 6:
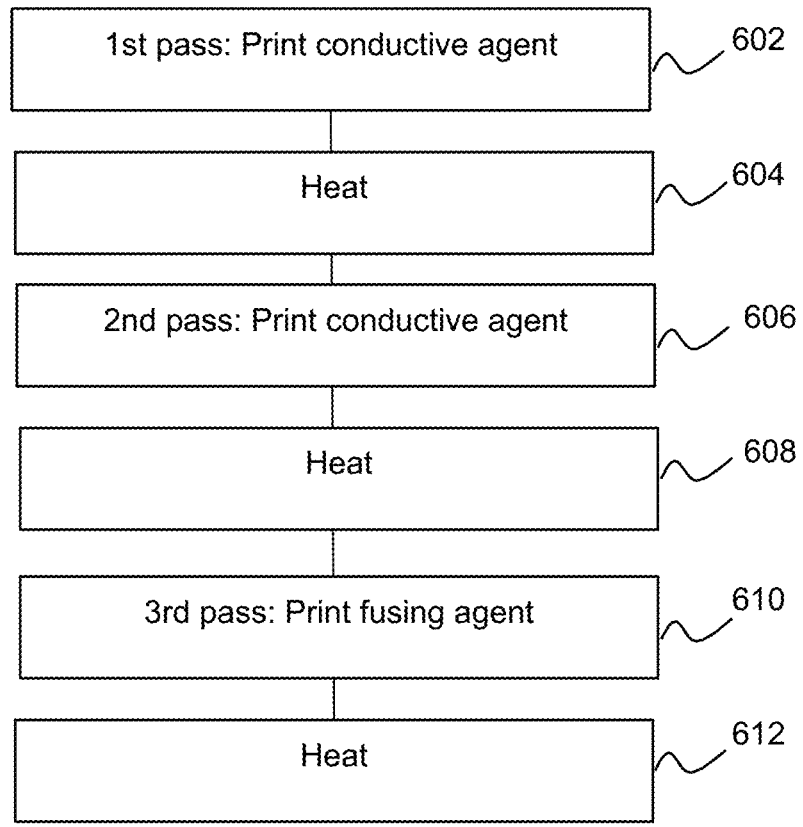

FIG. 6 is an example of a sequence in which treatment may be applied to a formed layer of build material which is to include a conductive element, and may for example follow block 502 as described in relation to FIG. 5.

In block 602, in a first printing pass, a conductive agent is printed. In block 604, the layer of build material is heated. As noted above, this may both raise conductive particles within the fusing agent to their fusing temperature (which may be around 140° C.) and cause evaporation of a carrier fluid. In some examples, a cooling agent (e.g. a detailing agent) may be applied to other regions of the build material during such a printing pass. This may reduce the formation of thermal gradients in such portion and/or prevent overheating of build material. Block 602 and 604 could be reversed in order or carried out concurrently (for example, the heating may be provided from an energy source provided on a print agent distributor).

In block 606, in a second printing pass, conductive agent is again applied to the same layer of build material and in block 608, the layer is again heated. In some examples, in order to provide a sufficient amount of conductive agent to attain an intended level of conductivity for the conductive element and to allow for the fusing temperature to be reached, two or more separate cycles of application and heating may be carried out. In practice, the number of printing passes in which conductive agent is applied and the amount applied in each pass may be determined based on the attributes of the agent and an intended conductivity level. Again, in some examples a cooling agent (e.g. a detailing agent) may be applied to other regions (i.e. a region which is not to be fused to form a conductive element) of the build material during such a printing pass. Block 606 and 608 could be reversed in order or carried out concurrently.

In block 610, in a third printing pass, fusing agent is printed on the build material layer. This may be applied at a relatively low contone level. This may allow an insulating substrate to be formed where the fusing agent is itself at least somewhat conductive: as the amount of fusing agent may be kept low, the conductivity of a region of build material caused to fuse with a small amount of fusing agent may also be kept low. In some examples, no fusing agent may be applied in the same locations as the conductive agent, and the fusing agent may instead be applied to other portions of the build material layer. In block 612, the layer is again heated. Block 610 and 612 could be reversed in order or carried out concurrently.

The level of fusing agent applied and the heating delivered in the third printing pass may be selected (bearing in mind the level of preheating of the build material provided by previous printing passes) so as to allow the build material to reach its fusing temperature, which may be around 150-200° C. in some examples.

In some examples, there may be a 'non-print' pass at this point if it is determined that additional energy is indicated to allow the built material to reach its fusing temperature. Again, detailing agent may be applied during such a pass. Detailing agent may also be employed to mark the edge of the fabricated object.

In the example of FIG. 6, the fusing agent is applied after the conductive agent. However, in some examples, fusing agent may be applied before a conductive agent. This could start to melt the build material within a layer, which may provide conditions where the conductor could reside on the top part of the layer (for example in the top 50 um of a 100 um layer). In other examples, it may be intended for the conductive element to form at the lower end of the layer, and/or to intermingle with other sub-layers, thus forming a sub-surface conductive via or the like.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
identifying, by a processor and from object model data for a physical object, a first region of an object layer comprising an indication of a conductive element;
printing, using an additive manufacturing apparatus, the object layer comprising the first region comprising the conductive element, and a second region comprising an insulating composition;
applying, using the additive manufacturing apparatus, a first amount of at least one fusing agent to the object layer within the first region;
applying, using the additive manufacturing apparatus, a second amount of the at least one fusing agent to the object layer within the second region, wherein the first amount of the at least one fusing agent is selected to be less than the second amount of the at least one fusing agent based on identifying the first region as comprising the indication of the conductive element; and
fusing, using the additive manufacturing apparatus, at least one layer of build material from which the object layer is formed by controlling irradiation of the at least one fusing agent by the additive manufacturing apparatus in the first region and the second region.

2. The method of claim 1, further comprising:
printing, using the additive manufacturing apparatus, a fusible conductive agent in the first region before applying the first amount and the second amount of the at least one fusing agent.

3. The method of claim 1, further comprising:
controlling, by the processor, either or both of an irradiation time and an irradiation intensity during the irradiation of the at least one fusing agent by the additive manufacturing apparatus in the first region and the second region.

4. The method of claim 1, further comprising:
controlling, by the processor, the irradiation of the at least one fusing agent by the additive manufacturing apparatus using a non-print pass.

5. The method of claim 1, further comprising:
controlling, by the processor, the irradiation of the at least one fusing agent by the additive manufacturing apparatus based on the first amount of the fusing agent.

6. The method of claim 1, wherein either:
the processor is part of an apparatus separate from the additive manufacturing apparatus; or
the processor is part of the additive manufacturing apparatus.

* * * * *